(12) United States Patent
Sanchez et al.

(10) Patent No.: US 8,669,590 B2
(45) Date of Patent: Mar. 11, 2014

(54) METHODS AND APPARATUS FOR FORMING SILICON GERMANIUM-CARBON SEMICONDUCTOR STRUCTURES

(75) Inventors: Errol Antonio C. Sanchez, Tracy, CA (US); Yi-Chiau Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 95 days.

(21) Appl. No.: 13/218,782

(22) Filed: Aug. 26, 2011

(65) Prior Publication Data

US 2013/0026540 A1 Jan. 31, 2013

Related U.S. Application Data

(60) Provisional application No. 61/511,604, filed on Jul. 26, 2011.

(51) Int. Cl.
*H01L 29/78* (2006.01)

(52) U.S. Cl.
USPC ........... 257/192; 438/207; 438/483; 438/518; 438/199; 438/300

(58) Field of Classification Search
USPC ............. 257/192, 616, 19, 347, 325, E29.001
See application file for complete search history.

(56) References Cited

U.S. PATENT DOCUMENTS

| 5,986,287 | A | 11/1999 | Eberl et al. | |
|---|---|---|---|---|
| 7,098,095 | B1 | 8/2006 | Naem et al. | |
| 2002/0033511 | A1 | 3/2002 | Babcock et al. | |
| 2002/0105015 | A1 | 8/2002 | Kubo et al. | |
| 2004/0048439 | A1 * | 3/2004 | Soman et al. | 438/309 |
| 2004/0256639 | A1 * | 12/2004 | Ouyang et al. | 257/202 |
| 2005/0153495 | A1 * | 7/2005 | Liu | 438/197 |
| 2006/0234479 | A1 * | 10/2006 | Liu et al. | 438/483 |
| 2006/0249815 | A1 * | 11/2006 | Forbes et al. | 257/616 |
| 2007/0045706 | A1 * | 3/2007 | Bhattacharyya et al. | 257/314 |
| 2010/0081293 | A1 * | 4/2010 | Mallick et al. | 438/794 |
| 2011/0121364 | A1 | 5/2011 | Donkers et al. | |

FOREIGN PATENT DOCUMENTS

KR 10-2009-0044566 A 5/2009

OTHER PUBLICATIONS

Marc Heyns, et al., "Ge and III-V Devices for Advanced CMOS", 10th International Conference on Ultimate Integration of Silicon, 2009, Mar. 18-20, 2009, pp. 83-86. Downloaded on Oct. 26, 2009 from IEEE Xplore.

Search Report and Written Opinion mailed Nov. 28, 2012 for PCT Application No. PCT/US2012/047977.

* cited by examiner

*Primary Examiner* — Benjamin Sandvik
*Assistant Examiner* — Rodolfo Fortich
(74) *Attorney, Agent, or Firm* — Moser Taboada; Alan Taboada

(57) ABSTRACT

Methods and apparatus for forming semiconductor structures are disclosed herein. In some embodiments, a semiconductor structure may include a first germanium carbon layer having a first side and an opposing second side; a germanium-containing layer directly contacting the first side of the first germanium carbon layer; and a first silicon layer directly contacting the opposing second side of the first germanium carbon layer. In some embodiments, a method of forming a semiconductor structure may include forming a first germanium carbon layer atop a first silicon layer; and forming a germanium-containing layer atop the first germanium carbon layer.

19 Claims, 4 Drawing Sheets

METHODS AND APPARATUS FOR FORMING SILICON GERMANIUM-CARBON SEMICONDUCTOR STRUCTURES

CROSS-REFERENCE TO RELATED APPLICATIONS

This application claims benefit of U.S. provisional patent application Ser. No. 61/511,604, filed Jul. 26, 2011, which is herein incorporated by reference.

FIELD

Embodiments of the present invention generally relate to methods and apparatus for forming semiconductor structures.

BACKGROUND

As the critical dimensions of semiconductor devices continue to shrink, a thermal process window, for example such as a range of temperatures available to deposit a layer in a semiconductor device, may become more narrow. For example, the thermal process window may become more narrow to limit or prevent unwanted diffusion of atoms between device layers. Unfortunately, due to the narrowing of the range of temperatures available in the thermal process window, the overall quality of the device layer formed may be poor, for example, such as in terms of crystallinity, homogeneity, or other structural properties. As such, the poor layer quality may result in poor electrical conductivity, or other such properties that allow the semiconductor device to function efficiently.

Accordingly, the present invention provides methods and apparatus for forming a semiconductor structure.

SUMMARY

Methods and apparatus for forming semiconductor structures are provided herein. In some embodiments, a semiconductor structure includes a first germanium carbon layer having a first side and an opposing second side; a germanium-containing layer directly contacting the first side of the first germanium carbon layer; and a first silicon layer directly contacting the opposing second side of the first germanium carbon layer.

In some embodiments, a method of forming a semiconductor structure may include forming a first germanium carbon layer atop a first silicon layer; and forming a germanium-containing layer atop the first germanium carbon layer. In some embodiments, the method may include forming a second germanium carbon layer atop the germanium-containing layer; and forming a second silicon layer atop the second germanium carbon layer.

In some embodiments, a method for forming a semiconductor structure may include forming a first germanium carbon layer atop a first silicon layer; forming a germanium-containing layer atop the first germanium carbon layer; forming a second germanium carbon layer atop the germanium-containing layer; forming a second silicon layer atop the second germanium carbon layer at a first temperature ranging from about 500 to about 700 degrees; and annealing the germanium-containing layer at a second temperature ranging from the first temperature to about 800 degrees Celsius.

In some embodiments, the invention may be embodied on a computer readable medium having instructions stored thereon that, when executed by a processor, cause a process chamber to perform a method for forming a semiconductor structure in accordance with any of the embodiments described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
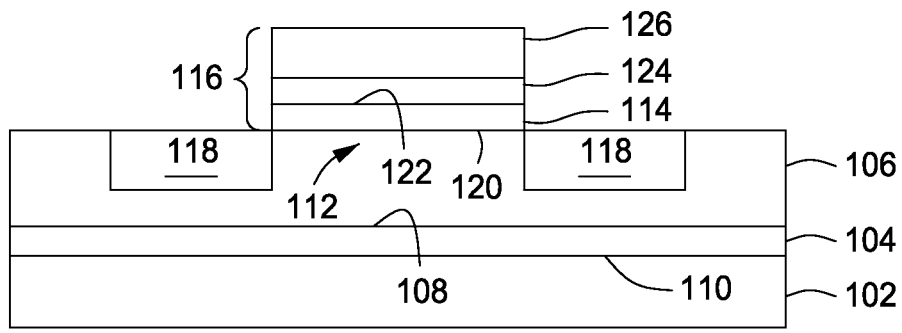
FIG. 1 depicts an exemplary non-limiting semiconductor structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for forming semiconductor structures are provided herein. The inventive semiconductor structure may have device layers, such a germanium carbon layer (GeC), to lessen or prevent diffusion from a germanium-containing layer into a silicon layer during deposition of device layer, annealing of devices layer, and/or other suitable processes requiring elevated temperatures that may result in unwanted diffusion of chemical species. The inventive methods, for example, which can include forming a GeC layer at one or more locations in the semiconductor structure may permit a higher thermal process window, such that device layers may be formed to have higher quality in crystalline structure or the like while limiting or preventing unwanted diffusion between device layers. Other and further embodiments are discussed below.

FIG. 1 depicts one exemplary non-limiting semiconductor structure in accordance with some embodiments of the present invention. For example, the semiconductor structure may be a planar metal-oxide-semiconductor field effects transistor (MOSFET) as illustrated in FIG. 1. However, this is merely one exemplary non-limiting embodiment of the semiconductor structure and any suitable semiconductor structure, for example having a germanium to silicon interface may benefit from embodiments of the present invention disclosed herein. For example, exemplary semiconductor structures that may be utilized with the present invention may in one or more of multi-gate FETs, memory cells, photovoltaic elements, or micro-electromechanical (MEMS) devices. Further, the semiconductor structure is illustrated in a simplified view in FIG. 1. Accordingly, it will be apparent to one of ordinary skill in the art that the semiconductor structure may include additional layers and/or features, such as shallow trench isolation regions (STI), metal silicide layers to couple source/drain and/or gate regions to an electron source, spacer regions proximate the gate stack, or other such features commonly found in semiconductor structures.

The semiconductor device may include a first silicon layer 102. For example, the first silicon layer 102 may be a semiconductor substrate or wafer, for example, such as a 200 or 300 mm diameter wafer and capable of having many semiconductor structures disposed thereon to form circuits, memory cells, logic gates, or the like. For example, the first silicon layer 102 as may comprise a material such as crystalline silicon (e.g., Si<100> or Si<111>), silicon oxide, strained silicon, a silicon structure such as a fin or a nanowire or a cantilever, doped or undoped polysilicon, doped or undoped silicon wafers, patterned or non-patterned wafers, silicon membrane, or the like.

The semiconductor structure includes a first germanium carbon layer 104 disposed atop the first silicon layer 102 and in direct contact with the first silicon layer 102. For example, the first germanium carbon layer 104 may be utilized to limit and/or prevent diffusion of atoms from the first silicon layer 102 into a germanium-containing layer 106, for example, during one or more deposition or annealing processes described below in accordance with a method 200 for forming the semiconductor structure. The first germanium carbon layer 104 may have a thickness ranging from about 50 to about 300 angstroms. For example, in some embodiments, the thickness may range from about 100 to about 300 angstroms. The first germanium carbon layer 104 may have a carbon content of at least about $10^{20}$ atoms/cm$^3$. The carbon content may vary depending on thermal budgets requirements and/or the thickness of the first germanium carbon layer 104. For example, in some embodiments, the carbon content may range from about $1\times10^{20}$ to about $8\times10^{20}$ atom/cm$^3$ depending on thermal budgets requirements and/or the thickness of the first germanium carbon layer 104. As illustrated in FIG. 1, the first germanium carbon layer 104 includes a first side 108 and an opposing second side 110. The germanium-containing layer 106 may directly contact the first side 108 of the first germanium carbon layer 104 as shown. Similarly, the first silicon layer 102 may directly contact the opposing second side 110 of the first germanium carbon layer 104 as shown. For example, the first germanium carbon layer 104 may be provided to limit or prevent diffusion of germanium and/or other elements included in the germanium-containing layer 106 into the first silicon layer 102, for example, during annealing, layer formation, and/or other method steps as discussed below in accordance with the method 200.

The germanium-containing layer 106 may be germanium (Ge), germanium silicon (GeSi), or the like. The germanium-containing layer 106 may include dopants to make the germanium-containing layer 106 negatively doped or positively doped for use in a semiconductor device, such as a MOSFET. For example, the germanium-containing layer 106 may include dopants such as phosphorous (P), antimony (Sb), or arsenic (As), to make the germanium-containing layer 106 negatively doped, or dopants such as boron (B) to make the germanium-containing layer 106 positively doped. The germanium-containing layer 106 may include a channel region 112 disposed in the germanium-containing layer 106 and below a second germanium carbon layer 114. For example, as illustrated in FIG. 1, the second germanium carbon layer 114 may form the base of a gate stack 116, where the gate stack 116 may be disposed above the channel region 112. The germanium-containing layer 106 may include source/drain regions 118 disposed in the germanium-containing layer 106 on opposing sides of the channel region 112. The source/drain regions 118 may include facets (not shown) which can partially extend under the gate stack 116 or other such features common known in the art for source/drain regions 118. The source/drain regions 118 may be formed from one or more of germanium (Ge), dopants, strain-adjusting elements, or the like. For example, the source/drain regions 118 may be oppositely doped relative to the channel region 112. For example, the source/drain regions 118 may include the strain-adjusting elements such as adjust strain in the channel region 112 to improve device performance.

The gate stack 116 includes the second germanium carbon layer 114, where the second germanium carbon layer 114 may be disposed above the germanium-containing layer 106. Similar to the first germanium carbon layer, the second germanium carbon layer 114 may directly contact the germanium-containing layer on a first side and directly contact a silicon layer on an opposing second side. For example, as illustrated in FIG. 1, the second germanium carbon layer 114 may include a first side 120 which may directly contact the germanium-containing layer 106 and an opposing second side 122 which may directly contact a second silicon layer 124 disposed above the second germanium carbon layer 114.

For example, similar to the first germanium carbon layer 104, the second germanium carbon layer 114 may be utilized to limit and or prevent diffusion of germanium (Ge) from the germanium-containing layer 106 into the second silicon layer 124, for example, during the formation of the second silicon layer 124. As discussed above regarding the first germanium carbon layer 104, the presence of the second germanium carbon layer 114 may facilitate the availability of a larger thermal process window for forming the second silicon layer 124 and/or other advantages, such as the use of previously unavailable source materials, such as process gases or precursors, to form the second silicon layer 124.

The first and second germanium carbon layers 104, 114 may have thicknesses ranging from about 20 to about 300 angstroms. For example, in some embodiments, the first germanium carbon layer 104 may have a thickness ranging from about 100 to about 300 angstroms. For example, in some embodiments, the second germanium carbon layer 114 may have a thickness ranging from about 20 to about 100 angstroms. For example, the second germanium carbon layer 114 may have a carbon content of at least about $10^{20}$ atoms/cm$^3$. The carbon content may vary depending on process requirements necessary to form the second silicon layer 124 and/or other components of the semiconductor structure. For example, the carbon content may range from about $1\times10^{20}$ to about $8\times10^{20}$ atoms/cm$^3$ depending on process requirements necessary to form the second silicon layer 124 and/or other components of the semiconductor structure. Generally, carbon content in the first or second germanium carbon layers 104, 114 may be increased in accordance processes that require higher temperatures.

The gate stack 122 may include a high-k dielectric layer 126 disposed atop the second silicon layer 124. For example, as used herein, a high-k dielectric may include those dielectric materials having a dielectric constant greater than about 3.9. Exemplary high-k dielectrics may include aluminum oxide ($Al_2O_3$), hafnium oxide ($HfO_2$), or lanthanum oxide ($La_2O_3$).

The gate stack 122 may include other layers, for example, such as a semiconducting or metal layer to form the gate above the high-k dielectric layer 126 and/or metal silicide layers or the like for attaching electrical connections to the gate. Further, the gate stack 122 may include additional layers depending upon the type of structure being formed. For example, the gate stack 122 may include additional metal layers, dielectric layers or the like, such as to form floating gates or the like, which may be utilized for memory structures, such as Random Access Memory (RAM) or Flash memory cells.

Figure 2:
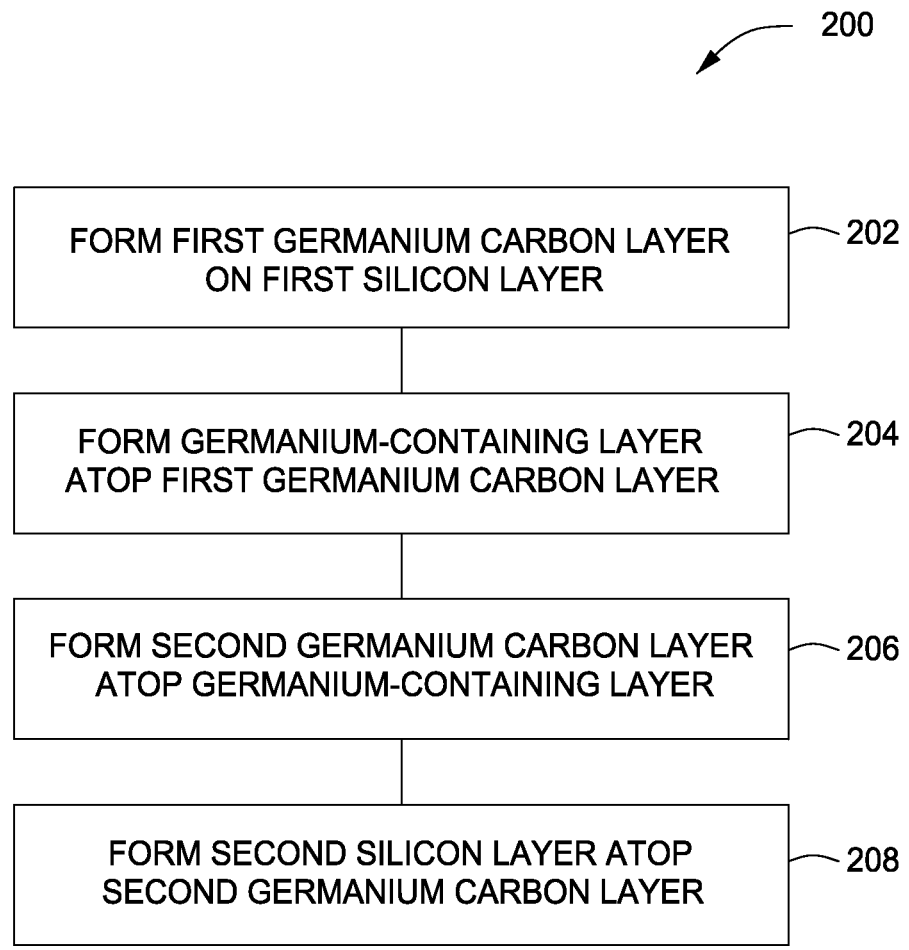
FIG. 2 depicts a flow chart for a method of forming a semiconductor structure.

The semiconductor structure discussed above and illustrated in FIG. 1 may be fabricated using a method 200 as disclosed herein. FIG. 2 depicts a flow chart for the method 200 for fabricating a semiconductor structure, such as the semiconductor structure. The method 200 is described below in accordance to the stages of fabrication of the semiconductor structure as illustrated in FIG. 3A-E. The method 200 may be performed in any suitable process chamber, such as a process chamber configured for epitaxial deposition or the like. One exemplary process chamber is described below and illustrated in FIG. 3.

Figure 3A:
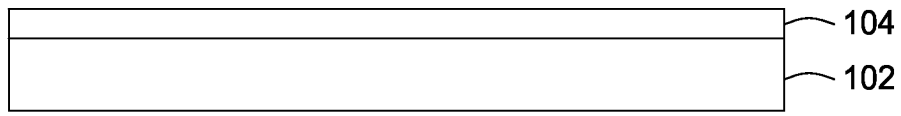
FIGS. 3A-E depict the stages of fabrication of a semiconductor structure in accordance with some embodiments of the present invention.
Figure 3B:
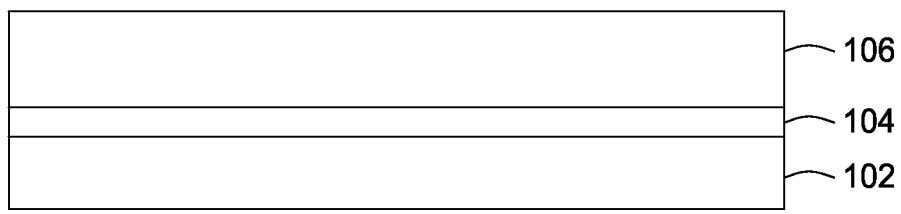

The method 200 begins at 202 by forming the first germanium carbon layer 104 on the first silicon layer 102 as illustrated in FIG. 3A. The first silicon layer 102 and the first germanium carbon layer 104 have been discussed above in terms of dimensions, composition and the like. The first germanium carbon layer 104 may be formed by co-flowing a germanium source gas and a carbon source gas. For example, the germanium source gas may include one or more of germane ($GeH_4$), digermane ($Ge_2H_6$), or higher order hydride gases thereof. The germanium source gas may be flowed in a carrier gas, such as hydrogen ($H_2$) or the like. For example, the carbon source gas may include germanium (Ge), carbon (C), and hydrogen (H). One exemplary carbon source gas may be methylgermane ($CH_3GeH_3$). The germanium source gas and the carbon source gas may be co-flowed at temperatures ranging from about 300 degrees Celsius to about 650 degrees Celsius. In some embodiments, the germanium source gas may include $Ge_2H_6$ co-flowed with the carbon source gas at about 300 degrees Celsius. As discussed above, the carbon content in the first germanium carbon layer 104 may vary. For example, the carbon content in the first germanium carbon layer 104 may be varied by adjusting the flow ratio of the germanium source gas to the carbon source gas.

At 204, the germanium-containing layer 106 may be formed atop the first germanium carbon layer 104. For example, as discussed above, the germanium-containing layer 106 may include one or more of germanium (Ge), silicon (Si), dopants or the like. For example, when the germanium-containing layer comprises germanium (Ge), a germanium source gas, such as one or more of the germanium source gases discussed above at 202, and/or other germanium source gases, may be provided to form the germanium-containing layer 106. For example, the germanium source gas may be flowed with a carrier gas such as hydrogen ($H_2$) or the like. Alternatively, when the germanium-containing layer 106 comprises germanium silicon (GeSi), the germanium source gas may be co-flowed with a silicon source gas to form the germanium-containing layer 106. Examples of suitable silicon source gases include one or more of silane ($SiH_4$), disilane ($Si_2H_6$), dichlorosilane ($H_2Si_2Cl_2$) or the like. In some embodiments, any of the source gases in any of the embodiments for forming the germanium-containing layer 106 may be flowed using a carrier gas. Further, any of the source gases may be co-flowed with a dopant source gas, for example, to dope the germanium-containing layer 106 such that it includes either positive or negative charger carriers. Alternatively, the dopant may be implanted after formation of the germanium-containing layer 106, for example, by ion implantation or any suitable implantation technique known in the art.

Figure 3C:
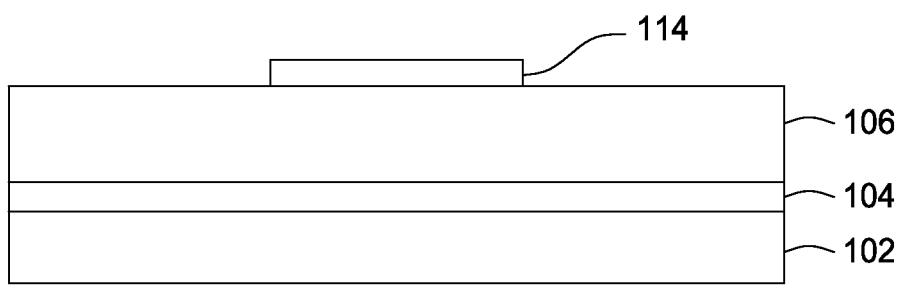
Figure 3D:
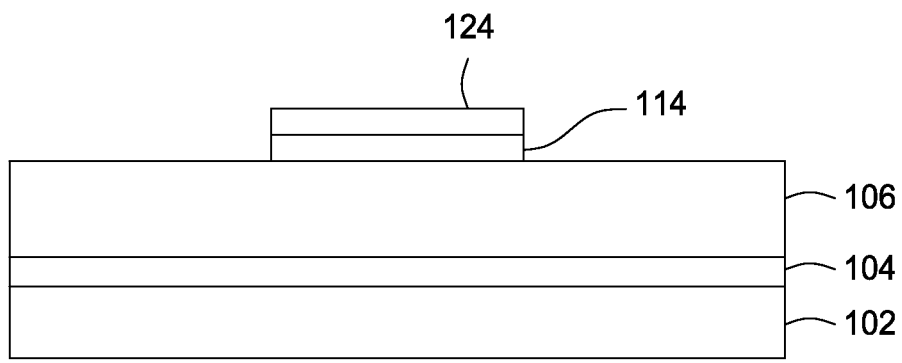
Figure 3E:
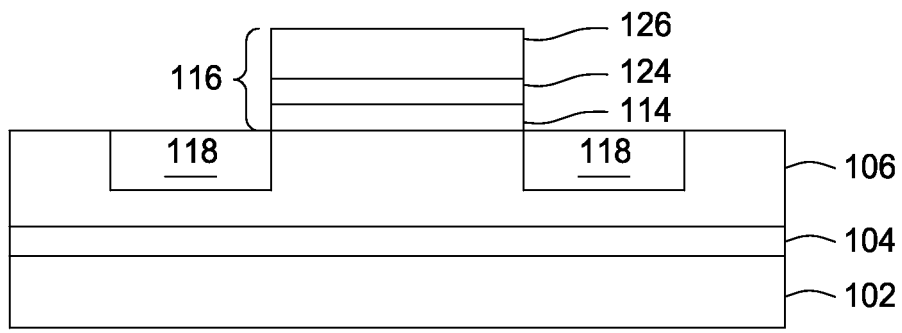

At 206, the second germanium carbon layer may be formed atop the germanium-containing layer 106 as illustrated in FIG. 3C. For example, a patterned mask layer (not shown), such as a photoresist, hard mask or the like, may be deposited and patterned preceding the formation of the second germanium carbon layer 114. The patterned mask layer may be used to define the dimensions of the second germanium carbon 114 along the surface of the germanium-containing layer 106 and, at least partially, the width of the channel region 112. The second germanium carbon layer 114 may be formed using similar methods as discussed above for the first germanium carbon layer 104. For example, the second germanium carbon layer 114 may be formed by co-flowing a germanium source gas and a carbon source gas. For example, the germanium source gas may include one or more of germane ($GeH_4$), digermane ($Ge_2H_6$), or higher order hydride gases thereof. The germanium source gas may be flowed in a carrier gas, such as hydrogen ($H_2$) or the like. For example, the carbon source gas may include germanium (Ge), carbon (C), and hydrogen (H). One exemplary carbon source gas may be methylgermane ($CH_3GeH_3$). The germanium source gas and the carbon source gas may be co-flowed at temperatures ranging from about 300 degrees Celsius to about 650 degrees Celsius. In some embodiments, the germanium source gas may include $Ge_2H_6$ co-flowed with the carbon source gas at about 300 degrees Celsius. As discussed above, the carbon content in the second germanium carbon layer 114 may vary. For example, the carbon content in the second germanium carbon layer 114 may be varied by adjusting the flow ratio of the germanium source gas to the carbon source gas. At 208, the second silicon layer 124 may be formed atop the second germanium carbon layer 114 as illustrated in FIG. 3D. For example, the patterned mask layer (not shown) may still be present for the formation of the second silicon layer 124. The second silicon layer 124 has been discussed above in terms of dimensions, composition, and the like. The second silicon layer 124 may be formed by providing a silicon source gas. Exemplary silicon source gases may include any of the silicon source gases disclosed above with respect to 204. For example, one or more of the silicon source gases may be enabled due to the use of the second germanium carbon layer 114 which can limit diffusion of Ge from the germanium-containing layer 106 into the second silicon layer 124. For example, in some embodiments, such silicon source gases may not have been available for use at temperatures which limit diffusion in the absence of the second germanium carbon layer 124, for example, such as below about 500 degrees Celsius. For example, the second silicon layer 124 may be formed at temperatures (e.g., a first temperature) ranging from about 500 to about 700 degrees Celsius using one or more of the silicon source gases listed above, or any suitable silicon source gas that may be used to form silicon layers of a desired quality level. The silicon source gas may be co-flowed with a carrier gas or the like. After the formation of the second silicon layer 124, one or more additional method steps may be utilized to form the semiconductor structure as illustrated in FIG. 3E. For example, while the patterned mask layer is still present, the high-k dielectric layer 126 may be deposited atop the second silicon layer 124. For example, the high-k dielectric layer may be deposited using any suitable methods known in the art.

Similarly, the source/drain regions 118 may be formed, for example, after the completion of the gate stack 116, such as by providing a second patterned mask layer (not shown) to protect the gate stack 116, for example, while etching and/or depositing the source/drain regions 118 in the germanium-containing layer 106. For example, the germanium-containing layer 106 may be isotropically and/or directional etched to form etched regions in the germanium-containing layer 106 for deposition the source/drain regions 118. The source drain regions 118 may be deposited in the etched regions, using any suitable methods known in the art. For example, one or more of a germanium source gas, a dopant source gas, a strain adjusting source gas, or the like may be utilized to deposit the source/drain regions 118. For example, the strain adjusting source gas maybe utilized to adjust one or more lattice parameters of the source/drain regions 118 such that strain is applied to the channel region 112. For example, strain in the channel region 112 may alter the electrical properties of the channel region 112 to improve overall device performance, such as response time or the like. Alternatively, as discussed above, dopants may be implanted into the source/drain regions 118.

Further, one or more layers of the semiconductor structure may be annealed to improve the quality level of each layer. For example, the inventive methods may advantageously permit annealing at higher temperatures due to the presence of diffusion limiting layers, such as the first and second germanium carbon layers 104, 114. For example, the method 200 may include one or more annealing steps, for example, at any stage of the process where annealing may benefit layer quality. For example, after the source/drain regions have been deposited, the germanium-containing layer 106 may be annealed a second temperature ranging from the first temperature as discussed above (e.g., about 500 to about 700 degrees Celsius) to about 800 degrees Celsius. In some embodiments, the second temperature may be about 600 to about 800 degrees Celsius.

Figure 4:
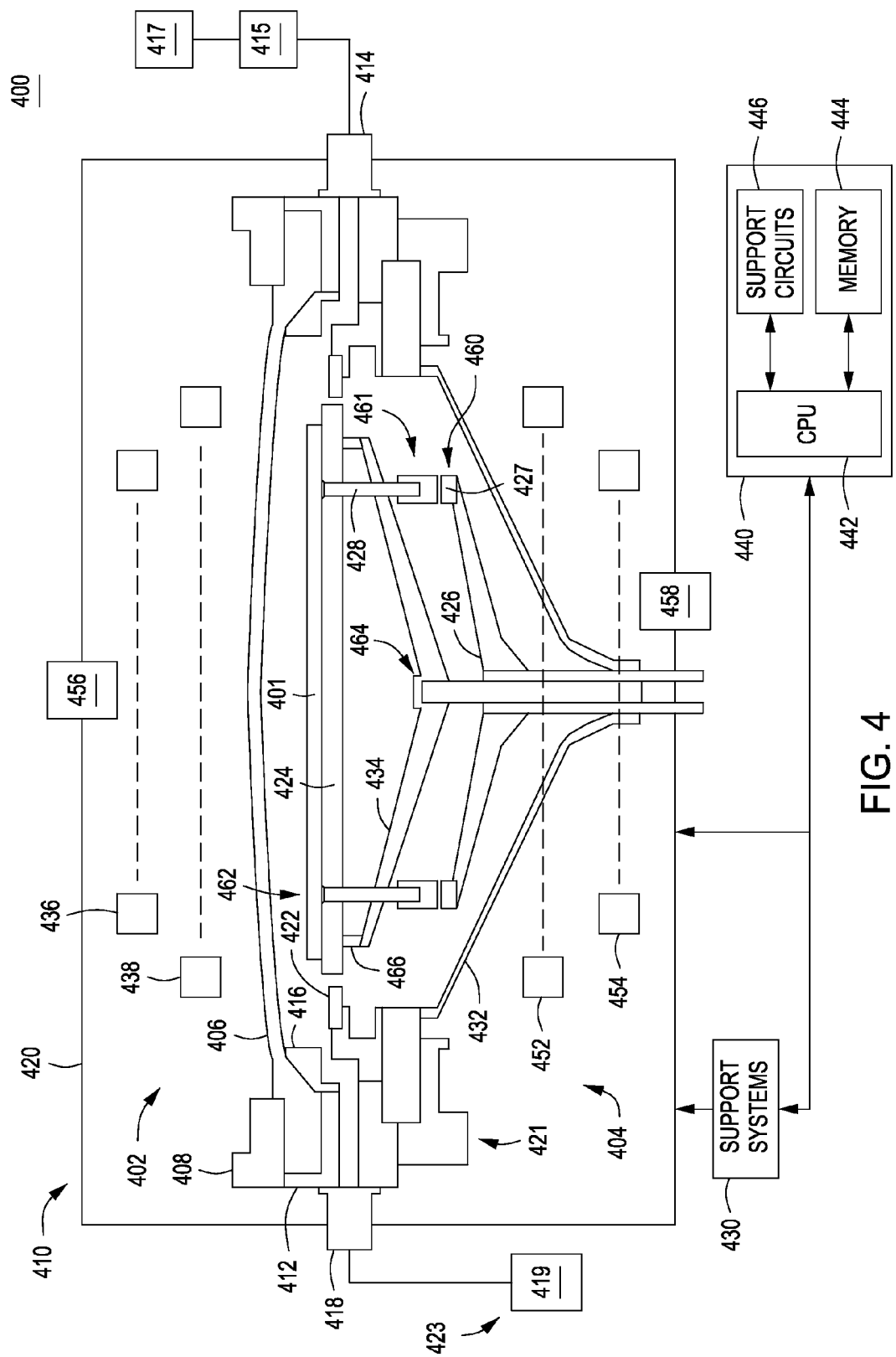
FIG. 4 depicts a process chamber suitable to perform the methods disclosed herein in accordance with some embodiments of the present invention.

Embodiments of the inventive methods disclosed herein may be used in any suitable process chamber, including those adapted for performing epitaxial deposition processes, such as the RP EPI reactor, available from Applied Materials, Inc. of Santa Clara, Calif. An exemplary process chamber is described below with respect to FIG. 4, which depicts a schematic, cross-sectional view of a semiconductor substrate process chamber 400 suitable for performing portions of the present invention. The process chamber 400 may be adapted for performing epitaxial deposition processes and illustratively comprises a chamber body 440, support systems 430, and a controller 440. The process chamber depicted in FIG. 4 is illustrative only and the present inventive methods may be used to advantage in other process chambers as well, including those configured for processes other than epitaxial deposition processes.

The chamber body 410 generally includes an upper portion 402, a lower portion 404, and an enclosure 420. A vacuum system 423 may be coupled to the chamber body 410 to facilitate maintaining a desired pressure within the chamber body 410. In some embodiments, the vacuum system 423 may comprise a throttle valve (not shown) and vacuum pump 419 which are used to exhaust the chamber body 410. In some embodiments, the pressure inside the chamber body 410 may be regulated by adjusting the throttle valve and/or vacuum pump 419. The upper portion 402 is disposed on the lower portion 404 and includes a lid 406, a clamp ring 408, a liner 416, a baseplate 412, one or more upper heating lamps 436 and one or more lower heating lamps 452, and an upper pyrometer 456. In some embodiments, the lid 406 has a dome-like form factor; however, lids having other form factors (e.g., flat or reverse curve lids) are also contemplated. The lower portion 404 is coupled to a process gas intake port 414 and an exhaust port 418 and comprises a baseplate assembly 421, a lower dome 432, a substrate support 424, a pre-heat ring 422, a substrate lift assembly 460, a substrate support assembly 464, one or more upper heating lamps 438 and one or more lower heating lamps 454, and a lower pyrometer 458. Although the term "ring" is used to describe certain components of the process chamber 400, such as the pre-heat ring 422, it is contemplated that the shape of these components need not be circular and may include any shape, including but not limited to, rectangles, polygons, ovals, and the like. A gas source 417 may be coupled to the chamber body 410 to provide one or more process gases thereto. In some embodiments, a purifier 415 may be coupled to the gas source 417 to filter or purify the one or more process gases prior to entering the chamber body 410.

During processing, the substrate 401 is disposed on the substrate support 424. The lamps 436, 438, 452, and 454 are sources of infrared (IR) radiation (i.e., heat) and, in operation, generate a pre-determined temperature distribution across the substrate 404. The lid 406, the clamp ring 408, and the lower dome 432 are formed from quartz; however, other IR-transparent and process compatible materials may also be used to form these components.

The substrate support assembly 464 generally includes a support bracket 434 having a plurality of support pins 466 coupled to the substrate support 424. The substrate lift assembly 460 comprises a substrate lift shaft 426 and a plurality of lift pin modules 461 selectively resting on respective pads 427 of the substrate lift shaft 426. In one embodiment, a lift pin module 461 comprises an optional upper portion of the lift pin 428 is movably disposed through a first opening 462 in the substrate support 424. In operation, the substrate lift shaft 426 is moved to engage the lift pins 428. When engaged, the lift pins 428 may raise the substrate 404 above the substrate support 424 or lower the substrate 404 onto the substrate support 424.

The support systems 430 include components used to execute and monitor pre-determined processes (e.g., growing epitaxial films) in the process chamber 400. Such components generally include various sub-systems. (e.g., gas panel(s), gas distribution conduits, vacuum and exhaust sub-systems, and the like) and devices (e.g., power supplies, process control instruments, and the like) of the process chamber 400. These components are well known to those skilled in the art and are omitted from the drawings for clarity.

The controller 440 may be provided and coupled to the process chamber 400 for controlling the components of the process chamber 400. The controller 440 may be any suitable controller for controlling the operation of a substrate process chamber. The controller 440 generally comprises a Central Processing Unit (CPU) 442, a memory 444, and support circuits 446 and is coupled to and controls the process chamber 400 and support systems 430, directly (as shown in FIG. 4) or, alternatively, via computers (or controllers) associated with the process chamber and/or the support systems.

The CPU 442 may be any form of a general purpose computer processor that can be used in an industrial setting. The support circuits 446 are coupled to the CPU 442 and may comprise cache, clock circuits, input/output subsystems, power supplies, and the like. The memory, or computer-readable medium, 444 of the CPU 442 may be one or more of readily available memory such as random access memory (RAM), read only memory (ROM), floppy disk, hard disk, or any other form of digital storage, local or remote. Software routines, such as the inventive methods disclosed herein, may be stored in the memory 444 of the controller 440. The software routines, when executed by the CPU 442, transform the CPU 442 into a specific purpose computer (controller) 440. The software routines may also be stored and/or executed by a second controller (not shown) that is located remotely from the controller 440. Alternatively or in combination, in some embodiments, for example where the process chamber 400 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 440 and may be coupled to the controller 440 to synchronize operation of the process chamber 400.

Thus, methods and apparatus for forming semiconductor structures have been provided herein. The inventive semiconductor structure may have device layers, such a germanium carbon layer (GeC) to lessen or prevent diffusion from the germanium-containing layer into a silicon layer during deposition of device layer, annealing of devices layer, and/or other suitable processes requiring elevated temperatures that may result in unwanted diffusion of chemical species. The inventive methods, for example, which can include forming a GeC layer at one or more locations in the semiconductor structure may permit a higher thermal process window, such that device layers may be formed to have higher quality in crystalline structure or the like while limiting or preventing unwanted diffusion between device layers.

While the foregoing is directed to embodiments of the present invention, other and further embodiments of the invention may be devised without departing from the basic scope thereof.

The invention claimed is:

1. A semiconductor structure, comprising:
 a first germanium carbon layer having a first side and an opposing second side;
 a germanium-containing layer directly contacting the first side of the first germanium carbon layer;
 a first silicon layer directly contacting the opposing second side of the first germanium carbon layer;
 a second germanium carbon layer disposed above the germanium-containing layer, the second germanium carbon layer having a first side and an opposing second side, wherein the first side of the second germanium carbon layer directly contacts the germanium-containing layer; and
 a second silicon layer disposed above the second germanium carbon layer, wherein the opposing second side of the second germanium carbon layer directly contacts the second silicon layer.

2. The semiconductor structure of claim 1, wherein the first germanium carbon layer has a thickness ranging from about 20 angstroms to about 300 angstroms.

3. The semiconductor structure of claim 1, wherein the first germanium carbon layer has a carbon content of at least about $10^{20}$ atoms/cm$^3$.

4. The semiconductor structure of claim 1, wherein the germanium-containing layer may be germanium (Ge) or germanium silicon (GeSi).

5. The semiconductor structure of claim 1, wherein the germanium-containing layer further comprises:
 a channel region disposed in the germanium-containing layer and below the second germanium carbon layer; and
 source/drain regions disposed in the germanium-containing layer on opposing sides of the channel region.

6. The semiconductor structure of claim 5, further comprising:
 a high-k dielectric layer disposed atop the second silicon layer.

7. The semiconductor structure of claim 6, wherein the first germanium carbon layer has a thickness ranging from about 100 angstroms to about 300 angstroms.

8. The semiconductor structure of claim 6, wherein the second germanium carbon layer has a thickness ranging from about 20 angstroms to about 100 angstroms.

9. The semiconductor structure of claim 6, wherein the second germanium carbon layer has a carbon content of at least about $10^{20}$ atoms/cm$^3$.

10. A method of forming a semiconductor structure, comprising:
 forming a first germanium carbon layer atop a first silicon layer;
 forming a germanium-containing layer atop the first germanium carbon layer;
 forming a second germanium carbon layer atop the germanium-containing layer; and
 forming a second silicon layer atop the second germanium carbon layer.

11. The method of claim 10, wherein the second silicon layer is formed at a temperature ranging from about 500 to about 700 degrees.

12. The method of claim 11, wherein forming the second silicon layer further comprises:
 flowing one or more silicon precursors to form the second silicon layer.

13. The method of claim 10, wherein forming the second germanium carbon layer further comprises:
 co-flowing a germanium source gas and a carbon source gas.

14. The method of claim 13, wherein the germanium and carbon source gases may be co-flowed at a temperature ranging from about 300 to about 650 degrees Celsius.

15. The method of claim 14, further comprising:
 annealing the germanium-containing layer.

16. The method of claim 10, further comprising:
 forming a high-k dielectric layer atop the second germanium carbon layer.

17. The method of claim 10,
 wherein the second silicon layer is formed atop the second germanium carbon layer at a first temperature ranging from about 500 to about 700 degrees; and further comprising:
 annealing the germanium-containing layer at a second temperature ranging from the first temperature to about 800 degrees Celsius.

18. The method of claim 17, wherein the first germanium carbon layer is formed to a thickness ranging from about 100 angstroms to about 300 angstroms and wherein the second germanium carbon layer is formed to a thickness ranging from about 20 angstroms to about 100 angstroms.

19. A semiconductor structure, comprising:
 a first germanium carbon layer having a first side and an opposing second side, wherein the first germanium carbon layer has a carbon content of at least about $10^{20}$ atoms/cm$^3$;
 a germanium-containing layer directly contacting the first side of the first germanium carbon layer; and
 a first silicon layer directly contacting the opposing second side of the first germanium carbon layer.

* * * * *